United States Patent [19]

Parniére et al.

[11] Patent Number: 4,554,517
[45] Date of Patent: Nov. 19, 1985

[54] DEVICE FOR THE AUTOMATIC LINEARIZATION OF THE CONTROL SIGNAL-FREQUENCY CHARACTERISTIC OF A FREQUENCY-MODULATED VARIABLE FREQUENCY OSCILLATOR

[75] Inventors: Alain Parniére, Rueil Malmaison; Dominique Bazenant, Paris, both of France

[73] Assignee: Thomson-CSF, Paris, France

[21] Appl. No.: 560,975

[22] Filed: Dec. 13, 1983

[30] Foreign Application Priority Data

Dec. 14, 1982 [FR] France .................................. 82 20967

[51] Int. Cl.⁴ .......................... H03C 3/08; H03C 3/09
[52] U.S. Cl. .......................................... 332/18; 331/2; 331/15; 331/23; 332/19; 332/21; 455/44; 455/113
[58] Field of Search ................... 332/19, 21, 30 V, 18; 331/2, 10, 11, 12, 15, 23, 25; 455/44, 113

[56] References Cited

U.S. PATENT DOCUMENTS

| 3,396,340 | 8/1968 | Black et al. ........................ 332/19 X |
| 4,027,264 | 5/1977 | Gutleber ............................ 329/122 X |
| 4,125,817 | 11/1978 | Bagdasarjanz et al. .............. 332/19 |
| 4,282,497 | 8/1981 | Hulbert ................................ 332/19 |

FOREIGN PATENT DOCUMENTS 0033256 8/1981 European Pat. Off. .

Primary Examiner—Siegfried H. Grimm
Attorney, Agent, or Firm—Cushman, Darby & Cushman

[57] ABSTRACT

A phase lock loop having an instruction input to which is applied the output signal of the frequency-modulated variable frequency oscillator. The pass band of the loop is regulated in order to obtain at its output, a frequency-filtered signal corresponding to the frequency-modulated signal applied to the instruction input. A phase demodulator having inputs coupled to the instruction input of the loop and to the output of the loop supplies a signal corresponding to the modulation index of the signal supplied by the oscillator. This signal is compared with a reference signal by a comparator circuit, which supplies a control signal to means for adjusting the amplitude of the modulating signal applied to the input of the oscillator, in order to permanently adjust the modulation index of the frequency-modulated signal, produced at the output of the oscillator, to the value of the desired modulation index corresponding to the reference signal.

5 Claims, 2 Drawing Figures

DEVICE FOR THE AUTOMATIC LINEARIZATION OF THE CONTROL SIGNAL-FREQUENCY CHARACTERISTIC OF A FREQUENCY-MODULATED VARIABLE FREQUENCY OSCILLATOR

The present invention relates to a device for the automatic linearization of the control signal-frequency characteristic of a frequency-modulated variable frequency oscillator. The control signal can either be a constant or variable amplitude signal constituted by an electrical voltage level or an electrical current level applied to the control input of the oscillator.

The variable frequency oscillators controlled by a signal are known and are frequently used for realizing frequency synthesizers with a high spectral purity and high resolution. It is advantageous to use frequency synthesizers in place of pilot frequency generators with fixed frequency crystals in local oscillators associated with frequency multipliers, because they make it possible to increase the frequency mobility of the radio and space links. Thus, it is easier and more economic to directly modulate synthesizers in frequency modulation, either by analog multiplex, or by a digital train, than to use independent frequency modulators with a fixed frequency, followed by frequency conversion with the aid of a heterodyne signal from an unmodulated synthesizer.

However, certain difficulties are encountered in the construction of frequency modulation synthesizers for radio transmitters and it is necessary to overcome these. Thus, it is desirable in most applications for the purpose of ensuring a correct operation of the receivers, that the signal-to-noise ratio of the wave received after demodulation retains a constant value. This makes it necessary to maintain at the transmission level, a constant frequency modulation index in order to be able to demodulate at the receivers a wave modulated at the constant index, no matter what the frequency of the connecting channel. Thus, the principle of direct frequency modulation of the synthesizer requires that the slope of the frequency-voltage or frequency-current characteristic of the variable frequency oscillator used is as constant as possible within the useful variation range in order that the modulation index of the frequency-modulated signal retains an approximately constant value. However, unfortunately, this requirement is not fulfilled in most voltage-controlled, variable frequency oscillators, due more particularly to the inherent characteristic of the variable capacitance diodes of the Varicap type, used for tuning the oscillator to its operating frequency and for bringing about a frequency modulation thereof.

In the past, this problem has been solved by correcting the control voltage-frequency characteristic of the variable frequency oscillator with the aid of a diode linearization device, obtained by synthesizing the inverse characteristic of the frequency-voltage characteristics of the variable frequency oscillator, by successive approximations with the aid of a diode network. In the case of relatively large operating frequency bands, this solution leads to correctors having a large number of segments and the reproducibility of such linearized variable frequency oscillators is often difficult and requires large adjustments, due to the dispersions of the electrical characteristics of the diodes used.

Another solution is also known, which consists of realizing frequency synthesizers with the aid of YIG oscillators, whose control current-frequency characteristic is very linear, but which has the disadvantage of being extremely onerous. It is pointed out that YIG stands for Yttrium IRON Garnet. The YIG oscillator uses the gyroresonance phenomenon of the crystal and its operating frequency is adjusted with the aid of the magnetic field applied across the crystal.

SUMMARY OF THE INVENTION

The object of the invention is to obviate the aforementioned disadvantages.

The present invention therefore relates to a device for the automatic linearization of the control signal-frequency characteristic of a frequency-modulated variable frequency oscillator in which the operating frequency of the oscillator is obtained on the basis of a control signal applied to the control input of the oscillator and the modulation frequency is obtained on the basis of a modulating signal, whose amplitude is adjusted, by adjustment means, as a function of the modulation index of the desired frequency-modulated signal, the modulating signal being added to the control signal in order to obtain at the oscillator output, a frequency-modulated signal, wherein it comprises a phase lock loop having an instruction input, to which is applied a signal corresponding to the frequency-modulated signal supplied by the oscillator and whose pass band is regulated in order to obtain at its output a frequency-filtered signal corresponding to the frequency-modulated signal applied to the instruction input; a phase demodulator coupled by first and second inputs respectively to the instruction input and to the output of the phase lock loop in order to produce a signal corresponding to the modulation index of the frequency-modulated signal obtained at the oscillator output; as well as a comparator circuit coupled by a first input to the output of the phase demodulator and to the second input to which is applied a reference signal corresponding to the desired modulation index, in order to obtain at the comparator output, a control signal for the means for adjusting the amplitude of the modulating signal, so as to permanently adjust the modulation index of the frequency-modulated signal produced at the oscillator output to the value of the desired modulation index.

The device according to the invention has the advantage that it makes it possible to automatically linearize a frequency-controlled variable frequency oscillator, whose control voltage-frequency or control current-frequency characteristic can be of a random nature on a relatively broad frequency band. This solution permits the direct modulation of the synthesizers in frequency modulation, either by an analog multiplex, or by a digital multiplex. Compared with the diode linearization device, the device according to the invention requires no special setting, which greatly facilitates industrialization thereof. In addition, the construction of the device according to the invention only involves the use of a few supplementary electronic components and is therefore not difficult.

BRIEF DESCRIPTION OF THE DRAWINGS

The invention is described in greater detail hereinafter relative to non-limitative embodiments and the attached drawings, which show.

DESCRIPTION OF THE PREFERRED EMBODIMENT

Figure 1:
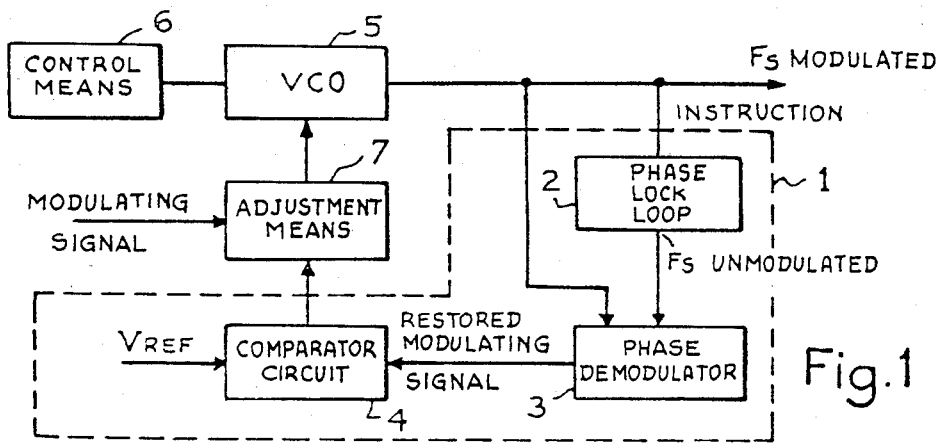
FIG. 1 is a circuit diagram of the automatic linearization device according to the invention.

The device according to the invention shown at 1 in FIG. 1 comprises a phase lock loop 2, a phase demodulator 3 and a comparator circuit 4. A variable frequency oscillator 5 connected to the device 1, is tuned to its operating frequency by the control means 6 and is frequency modulated by a modulating signal, applied to a modulation control input across adjustment means 7 for regulating the amplitude of the modulating signal applied to the modulation control input of the variable frequency oscillator 5, in order to keep constant the modulation index of the signal produced by oscillator 5. Device 1 is connected to the adjustment means 7 via the comparator circuit 4 and is connected to the output of oscillator 5 by the instruction input of the phase lock loop 2 and by a first input of the phase demodulator 3. The output signal of the phase lock loop 2 is phase-dependent on the signal supplied by the output of the variable frequency oscillator 5 and its transfer function is determined in such a way that its output signal reproduces the input signal, while being free from the modulation frequency of the input signal. Demodulator 3 compares the unmodulated signal applied to its first input by the output of the phase lock loop 2 with the modulated signal applied to its second input by the output of the variable frequency oscillator 5. In this way, the phase demodulator 3 restores the modulating signal and applies it to the first input of the comparator circuit 4, which compares it with a reference signal VREF applied to its second input and which corresponds to the value of the desired modulation index. The output of the comparator circuit 4 supplies to the control input of the adjustment means 7 a control signal, whose value corresponds to the difference in the values of the modulating signal and the reference signal VREF, in order to permit the feedback loop, constituted by the variable frequency oscillator 5 and the elements of the linearization device 1, to react so as to cancel out the difference between the modulating signal and the reference signal VREF detected by comparator circuit 4. When this difference is cancelled out, the modulation index of the frequency-modulated signal produced by the variable frequency oscillator 5 corresponds to the desired modulation index indicated by the level of the reference signal VREF.

Figure 2:
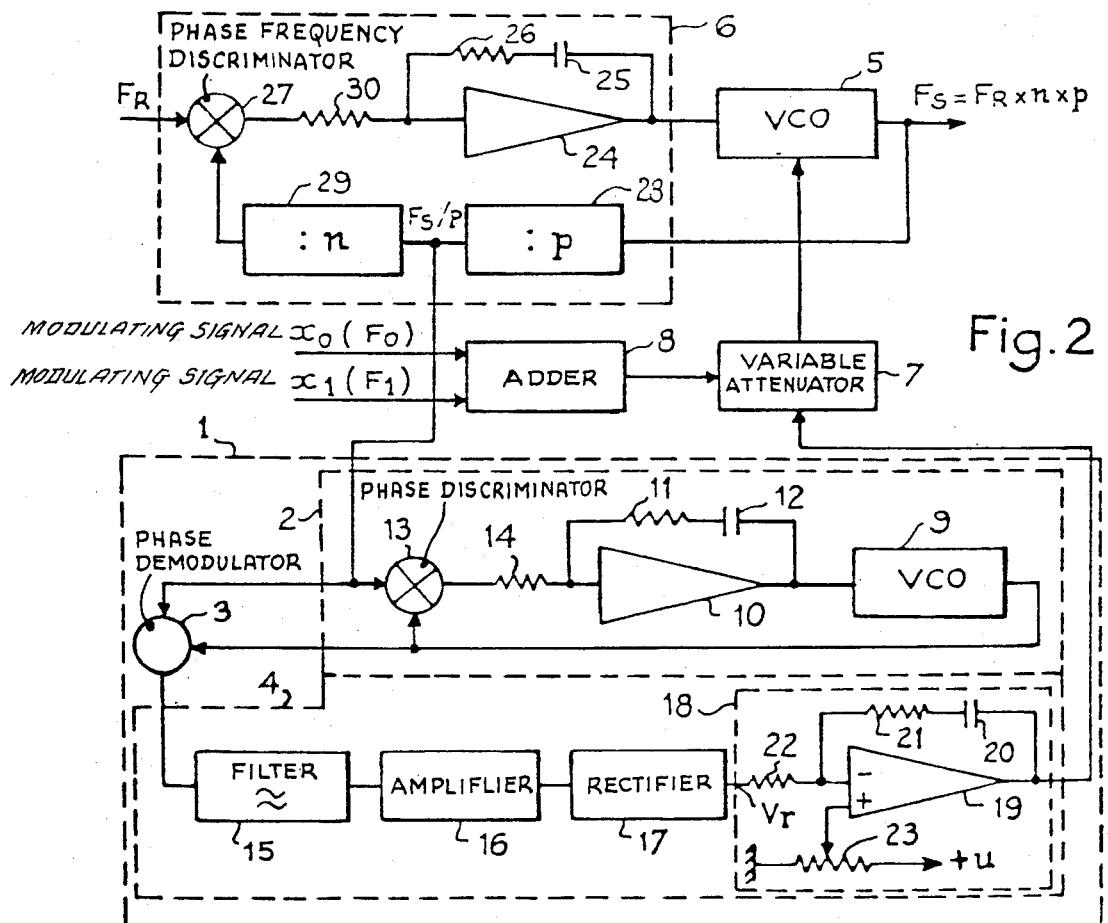
FIG. 2 is a detailed view of the device of FIG. 1.

A constructional variant of the device of FIG. 1 will now be described relative to the diagram of FIG. 2. In the latter, elements similar to those of FIG. 1 are designated by the same references. As in FIG. 1, the linearization device 1 comprises a phase lock loop 2, shown within a dotted line reactangle, a phase demodulator 3 and a comparator circuit 4, also shown within a dotted line system. The variable frequency oscillator 5 is controlled with the aid of control means 6 shown within a dotted line rectangle which, in the case of FIG. 2, are constituted by the loop of a frequency synthesizer. As in FIG. 1, the variable frequency oscillator 5 is controlled by device 1 across a variable attenuator 7. The modulating signal is applied to the input of variable attenuator 7 by the output of an adder 8 which, in FIG. 2, has the function of adding two sinusoidal signal $X_0$ and $X_1$ of respective frequencies $f_0$ and $f_1$, such that max. $f_1$ is less than $f_0$ and in which $X_1$ represents e.g. a modulation signal supplied by a not shown digital multiplex.

The phase lock loop 2 constituted by a variable frequency oscillator 9, is voltage-controlled by the output of an integrator, comprising an amplifier 10, whose input and output are connected by means of a resistor 11 and a capacitor 12, connected in series and whose input is also coupled to the output of a phase discriminator 13 across a resistor 14. The phase discriminator 13 has two inputs. A first input receives an instruction signal from the variable frequency oscillator 5 and the second input receives the signal from the variable frequency oscillator 9, constituting the output of the phase lock loop 2. As in the case of FIG. 1, the phase demodulator 3 receives the reference signal supplied by the variable frequency oscillator 5 at a first input and the signal supplied by the output of the phase lock loop 2 at its second input. The output of the phase demodulator 3 is applied to the input of the comparator circuit 4 constituted by a filter 15, an amplifier 16, a rectifier 17 and an integrator 18, which are connected in series. The integrator 18 is formed by a differential amplifier 19, whose output is relooped on the input marked "−" by means of a series-connected capacitor 20 and resistor 21. The input mark "−" of amplifier 19 is connected to the output of rectifier 17 by means of a resistor 22 and the input mark "+" of amplifier 19 is connected to the slider of a potentiometer 23, which is polarized by a constant bias voltage $+U$, so that the reference voltage VREF corresponding to the desired modulation index appears on the slider of potentiometer 23. The output of amplifier 19 is coupled to the control input of variable attenuator 7.

The loop of the frequency synthesizer constituting the control means 6 comprises integration means formed by an amplifier 24, whose output is coupled to the input by means of a series-connected capacitor 25 and resistor 26. The input of amplifier 24 is connected to the output of a phase/frequency discriminator 27 across a resistor 30. Discriminator 27 receives a reference frequency signal $F_R$ on a first input and is connected by a second input to the output of the variable frequency oscillator 5 by means of a fixed rank or order divider 28 and a variable rank or order divider 29, which are connected in series. If p designates the division rank of divider 28 and n the division rank of variable divider 29, the operating frequency $F_S$ obtained at the output of the variable frequency oscillator 5 is equal to the reference frequenc $F_R$ multiplied by the product $n \times p$ of the division ranks of dividers 28 and 29. The instruction signal applied to the first input of the phase discriminator 13 of the phase lock loop 2 and to the first input of the phase demodulator 3 is taken from the input of the fixed rank divider 28. In this way, the instruction signal has a frequency equal to the frequency $F_S$ of the signal from oscillator 5, divided by the rank p of divider 28. The variable rank divider 29 divides the frequency $F_S/P$ of the signal supplied by divider 28, in order to convert it into a frequency $F_S/n \times p$ which is compared with the reference frequenc $F_R$. An error signal is supplied by discriminator 27 which, after amplification and filtering, by the integration circuit comprising amplifier 24, makes it possible to make the frequency of the variable frequency oscillator 5 dependent on the frequency $F_S = F_R \times n \times p$.

The pass band of the loop of the synthesizer forming the control means 6 is sufficiently narrow to permit the direct frequency modulation of the variable frequency oscillator 5 across the variable attenuator 7, which is voltage-controlled by adder 8. The signal of frequency $F_S/P$ obtained at the output of divider 28 is itself frequency-modulated with a modulation index, which is divided by the rank p of divider 28. As stated hereinbefore in connection with the operation of FIG. 1, the phase lock loop 2 makes it possible to eliminate this modulation, if the integration constant of the integrator formed by amplifier 10 is sufficiently large to give the phase lock loop 2 a narrow loop pass band.

However, in the embodiment of FIG. 2, the phase lock loop 2 has the function of a selective filter, which makes it possible to record the modulating signal $X_1$ and eliminate the modulating signal $X_0$. This result is achieved by placing the cut-off frequency of the phase lock loop 2 between the two maximum frequencies $f_0$ and $f_1$ of the modulating signal $X_0$ and $X_1$ by acting on the integration constant of the integrator of loop 2.

Under these conditions, the demodulation of the signal $F_S/P$ from divider 28 is carried out directly by the phase discriminator 3, which receives on its first input the modulated signal $F_S/P$ and on its second input the signal $F_S/P$ which is free from the modulation frequency $f_0$ obtained at the output of the phase lock loop 2. The demodulated signal of frequency $f_0$ corresponding to the modulating sign $X_0$ from the phase discriminator 3 is filtered by filter 15, amplified by amplifier 16 and rectified by rectifier 17 to supply a d.c. voltage $V_r$, which images the modulation index of the signal supplied by the variable frequency oscillator 5, modulated by signal $X_0$. Voltage $V_r$ is compared with the chosen reference voltage VREF and the error signal, following amplification and filtering, by amplifier 19, capacitor 20 and resistors 21 and 22, controls the variable attenuator 17 placed on the path of modulation signal $X_0$ and $X_1$. The regulation of the modulation index then takes place by adjusting the instruction voltage VREF on the input marked "+" of amplifier 19.

In the embodiment of FIG. 2, the use of two modulation signal $X_0$ and $X_1$ is of particular interest in the case where the variable frequency oscillator 5 is intended to supply frequency to a tropospheric radio link with a frequency diversity requiring e.g. the simultaneous transmission of three equal amplitude, equidistant carriers. Thus, in this case, the processing of these three carriers can be carried out directly by modulation of the operating frequency using a large modulation index (m=1.43), in the way described e.g. in French Patent Application No. 8001898, filed by the assignee and corresponding to U.S. Pat. No. 4,363,132. In this case, the modulating signal $X_0$ makes it possible to generate the three equal amplitude lines, spaced by the frequency $f_0$ and the useful modulation signal $X_1$ makes it possible to modulate each of the three lines.

Although the principles of the present invention have been described hereinbefore in connection with a particular embodiment, it is clear that the description is only of an exemplified nature and in no way limits the scope of the invention.

What is claimed is:

1. A device for the automatic linearization of the control signal-frequency characteristic of a frequency-modulated variable frequency oscillator in which the operating frequency of the oscillator is obtained on the basis of a first control signal applied to the control input of the oscillator and the modulation frequency is obtained on the basis of a modulating signal whose amplitude is adjusted, by adjustment means, as a function of the modulation index of the desired frequency-modulated signal, the modulating signal being added to said first control signal in order to obtain said frequency-modulated signal at the output of said oscillator, comprising:

a phase lock loop having an output and an instruction input to which is applied a signal corresponding to said frequency-modulated signal, and a pass band which is regulated in order to obtain at said output a frequency-filtered signal corresponding to said frequency-modulated signal applied to said instruction input;

a phase demodulator coupled by first and second inputs respectively to said instruction input and to said output of said phase lock loop in order to produce a signal corresponding to the modulation index of said frequency-modulated signal; and a comparator circuit having an output and coupled by a first input to said phase demodulator, and having a second input to which is applied a reference signal corresponding to a desired modulation index, in order to obtain at said comparator output a second control signal which is provided to said adjustment means for adjusting the amplitude of said modulating signal so as to permanently adjust the modulation index of said frequency-modulated signal to the value of the desired modulation index.

2. A device according to claim 1, further including a phase frequency lock loop having control means with an output, and wherein said first control signal is supplied by said output of said control means of said phase/frequency lock loop.

3. A device according to claim 2, wherein said signal applied to said instruction input of said phase lock loop is provided by said phase/frequency lock loop and is obtained by dividing by (p) a frequency ($F_S$) of said frequency modulated signal by means of a frequency divider, where (p) is an integer.

4. A device according to claim 3, wherein said comparator circuit includes a filter, a first amplifier, a rectifier, and an integrator including a second amplifier which are connected in series, said rectifier supplying a voltage level corresponding to the modulation index of said frequency-modulated signal to said second amplifier in order to compare said voltage level obtained from said rectifier with a reference voltage corresponding to the desired modulation index.

5. A device according to claim 4, wherein said modulating signal results from the addition of two modulating signals of respective frequencies $f_0$ and $f_1$, such that frequency $f_0$ exceeds a maximum value which can be assumed by frequency $f_1$, wherein a cut-out frequency of said phase lock loop is regulated so as to exceed said maximum value of frequency $f_1$ and is below said frequency $f_0$, so that said frequency-filtered signal obtained at said output of said phase lock loop is free from said modulation frequency $f_0$, and wherein said reference signal applied to said second input of said comparator circuit corresponds to the desired modulation index of frequency modulation of said oscillator by said modulating signal of frequency $f_0$.

* * * * *